United States Patent [19]

Fischer

[11] 3,807,037

[45] Apr. 30, 1974

[54] POCKETABLE DIRECT CURRENT ELECTROLUMINESCENT DISPLAY DEVICE ADDRESSED BY MOS AND MNOS CIRCUITRY

[75] Inventor: Albert G. Fischer, Pittsburgh, Pa.

[73] Assignee: The United States of America as represented by the Secretary of the Army, Washington, D.C.

[22] Filed: Nov. 30, 1972

[21] Appl. No.: 310,737

[52] U.S. Cl. ........................ 29/577, 29/580, 29/583, 29/626

[51] Int. Cl. ............................................ B01j 17/00

[58] Field of Search ....... 29/577, 578, 580, 576 IW, 29/583, 589, 626; 317/234 N

[56] References Cited

UNITED STATES PATENTS

| | | | |
|---|---|---|---|
| 3,471,922 | 10/1969 | Legat | 29/580 |
| 3,621,562 | 11/1971 | Patel | 29/577 |
| 3,646,666 | 3/1972 | Boleky | 29/577 |
| 3,707,036 | 12/1972 | Okabe | 29/577 |

*Primary Examiner*—W. C. Tupman

*Attorney, Agent, or Firm*—Edward J. Kelly; Herbert Berl

[57] ABSTRACT

A small, pocket size, direct current flat electroluminescent display panel made of a single crystalline substrate having electroluminescent material on the front face and addressing circuitry on the back face. The addressing circuitry is conductively connected to the electroluminescent material through feedthrough holes in the substrate. The feedthrough holes are produced by electrons beams or laser beams, or by photoetching techniques. The addressing circuitry may be, for example, metallic oxide semiconductors or thin film transistors. A large scale integrated thin film transistor circuit could be deposited into a matrix, from a multiple of evaporation sources, through a system of registered masks positioned on the back side of the substrate. The electroluminescent material may comprise a matrix of light emitting diodes, or alternatively a solid sheet of Group II–VI heterojunction sandwich structure. The matrix of light emitting diodes may be made of gallium arsenide phosphide materials that are in exact registration with the addressing circuitry and connected thereto by conductors connected through the feedthrough holes.

Voltage pulses from shift registers in a predetermined pattern are applied to the matrix of addressing circuitry. Outputs from the addressing circuitry cause the electroluminescent material that is conductively connected thereto to conduct, providing a display in the predetermined pattern of the voltage pulses from the shift registers.

8 Claims, 2 Drawing Figures

POCKETABLE DIRECT CURRENT ELECTROLUMINESCENT DISPLAY DEVICE ADDRESSED BY MOS AND MNOS CIRCUITRY

BACKGROUND OF THE INVENTION

This invention is in the field of providing a matrices of direct current powered electroluminescent elements on a flat display panel.

Previously, panels had to be made with addressing circuitry positioned on one side thereof and of the exact lateral area as that of the display panel to avoid interconnection problems. For example, single crystal chips that hold integrated silicon circuitry are now limited to about 10 square inches area. The present invention alleviates the size restriction of electroluminescent display panels by disclosing a single crystalline substrate that has metallic oxide semiconductors, or thin film transistors, positioned on one side and light emitting diodes positioned on the opposite side and in direct registry with the metallic oxide semiconductors (MOS) or the thin film transistor (TFT) circuitry.

SUMMARY OF THE INVENTION

This invention is a direct current electroluminescent display panel on which a solid layer of electroluminescent material or individual light emitting diodes (LEDs) are addressed by MOSs or TFTs. Using the MOSs and LEDs in the preferred embodiment, these MOSs and LEDs are in exact registration with each other and on opposite sides of the panel. The panel is prepared by depositing silicon on a substrate made of some insulator material, such as a spinel or sapphire single crystal wafer. Holes are drilled through the substrate by electron or laser beams or by using photoetching techniques. One hole is provided for each related MOS and LED. Conductive material is deposited in the holes to connect the electrical outputs from the MOSs to the inputs of the LEDs. The MOSs are scanned by horizontal and vertical bucket brigade shift registers. Either layer of electroluminescent Group II–VI materials or the LEDs are deposited on the front side of the substrate after the addressing MOSs are deposited on the back side of the substrate.

DETAILED DESCRIPTION OF THE PREFERRED EMBODIMENT

Figure 1:
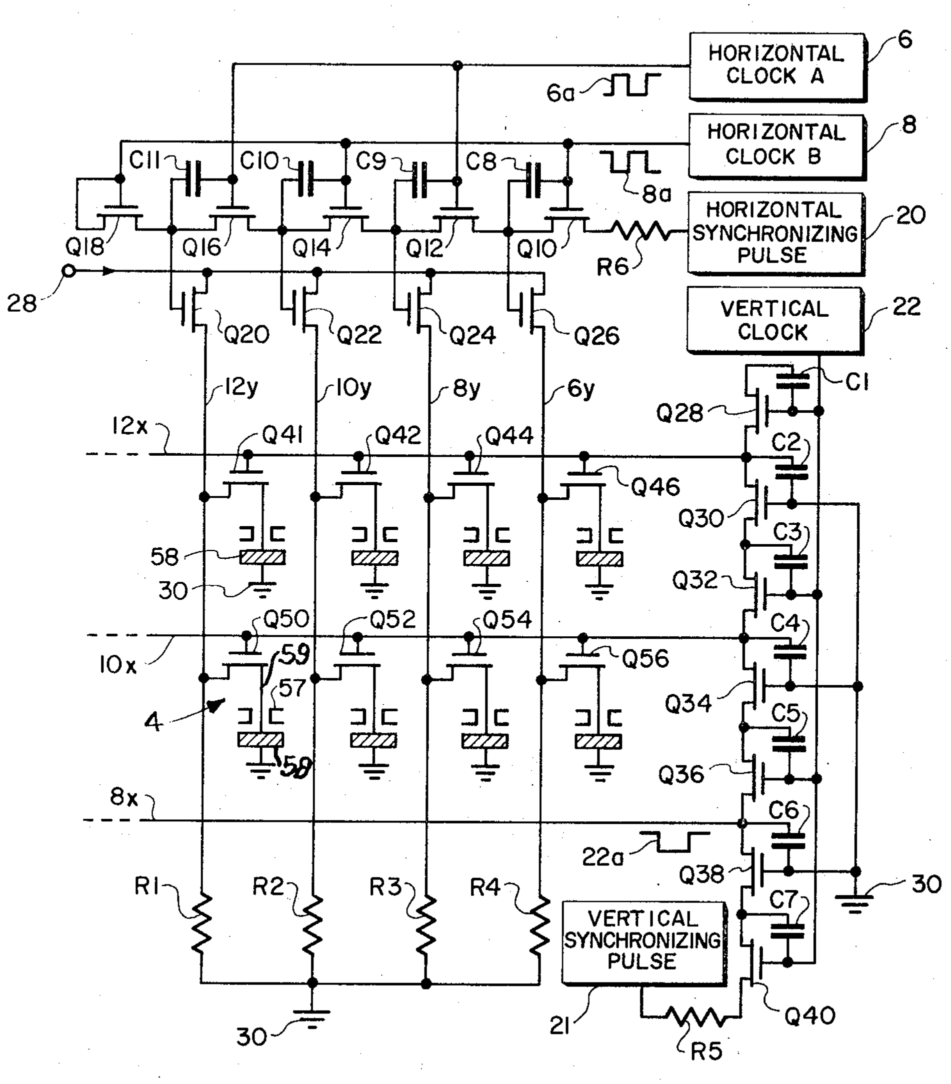
FIG. 1 is a schematic circuit showing horizontal and vertical bucket brigade type scanners feeding rows and columns of metallic oxide semiconductors for switching light emitting diodes.

The present invention is an electroluminescent display panel using a single crystalline substrate with a matrix of semiconductor addressing circuitry and electroluminescent elements mounted thereon. The electroluminescent elements may be deposited over the addressing circuitry on one side of the substrate or may be deposited on opposite sides of the substrate with conductive connections between the circuitry and elements through the substrate. The single crystalline substrate may be made of silicon epitaxially deposited on either sapphire or spinel. The silicon may be doped with arsenic for better conductivity. Alternatively, a polycrystalline ceramic substrate may be used.

The first layer deposited on the substrate is that of epitaxial silicon pads for making the MOS and MNOS semiconductor addressing circuitry. The addressing circuitry and interconnections therebetween are laid out on a photomask, the surface then coated with photoresist, and the coated surface illuminated with ultraviolet light. The desired silicon areas are then etched off with a mixture of hydrofluoric and nitric acids (HF-$HNO_3$). The surfaces are then oxidized to form thin SiO skins and these skins etched off with photoresist techniques where needed. Gate electrodes for the MOSs or MNOSs are then formed by metallization, or other known methods. Metal interconnections, forming column and row leads and referred to hereinbelow, are electroplated on by photoresist techniques. This fabrication technique closely follows the established method for manufacturing large scale integration (LSI) circuits.

Using the embodiment where deposits are made on both sides of the substrate, the MOS addressing circuitry is first deposited on the back of the substrate and then the electroluminescent layer is deposited on the front side of the substrate. The electroluminescent layer is in the form of a solid melt grown gallium-phosphide (GaP) ingot. The ingot is etched into a matrix of very small GaP electroluminescent elements 58. The process of producing the matrix of elements 58 on the front of the substrate is as follows. A rectangular wafer of GaP, cut from a larger melt grown GaP ingot, is coated with a liquid-phase-epitaxy grown double layer. The inner layer is contiguous with the substrate and is made of p-type material, while the outer layer is n-type material. Deep grooves are then etched or sawed through both the n-type and p-type layers and to the substrate. These grooves are then filled almost full with resin, or some other insulating cement. An indium-tin (In-Sn) layer is then r.f. sputtered over the whole surface with the In-Sn in ohmic contact with the n-GaP. The In-Sn layer, covering the n-type layer of the electroluminescent GaP layer, is then lapped off, leaving the In-Sn in contact with the n-GaP only in the grooves. This In-Sn forms the front electrode. Front electrode is connected to ground 30 (FIG. 1).

The preferred method of combining the addressing circuitry and the electroluminescent elements on the same side is to place the electroluminescent substrate directly on top of the circuitry panel, either by way of the screened-on conductive epoxy pads, or by applying soft solder dots and then warming the area around the solder deposit to provide good connection. The preferred method of interfacing the electroluminescent material and the addressing circuitry is by placing them on opposite sides of the same substrate and providing conductive feedthrough holes therebetween. These holes may be first drilled and then filled with conductive material. Instead of using GaP, the electroluminescent material may be made of GaAs-GaP alloys, or GaAs coated with an up-conversion phosphor which converts the infra-red emission into visible light. In the more detailed explanation of the embodiment shown below, FIG. 1 shows only MOS addressing circuitry and FIG. 2 shows the combined storage transistors of the metallic nitride oxide semiconductor (MNOS) type in conjunction with the MOS for addressing circuitry. The use of MNOSs along with MOSs reduces the amount of light needed for luminescing the electroluminescent element.

Figure 2:
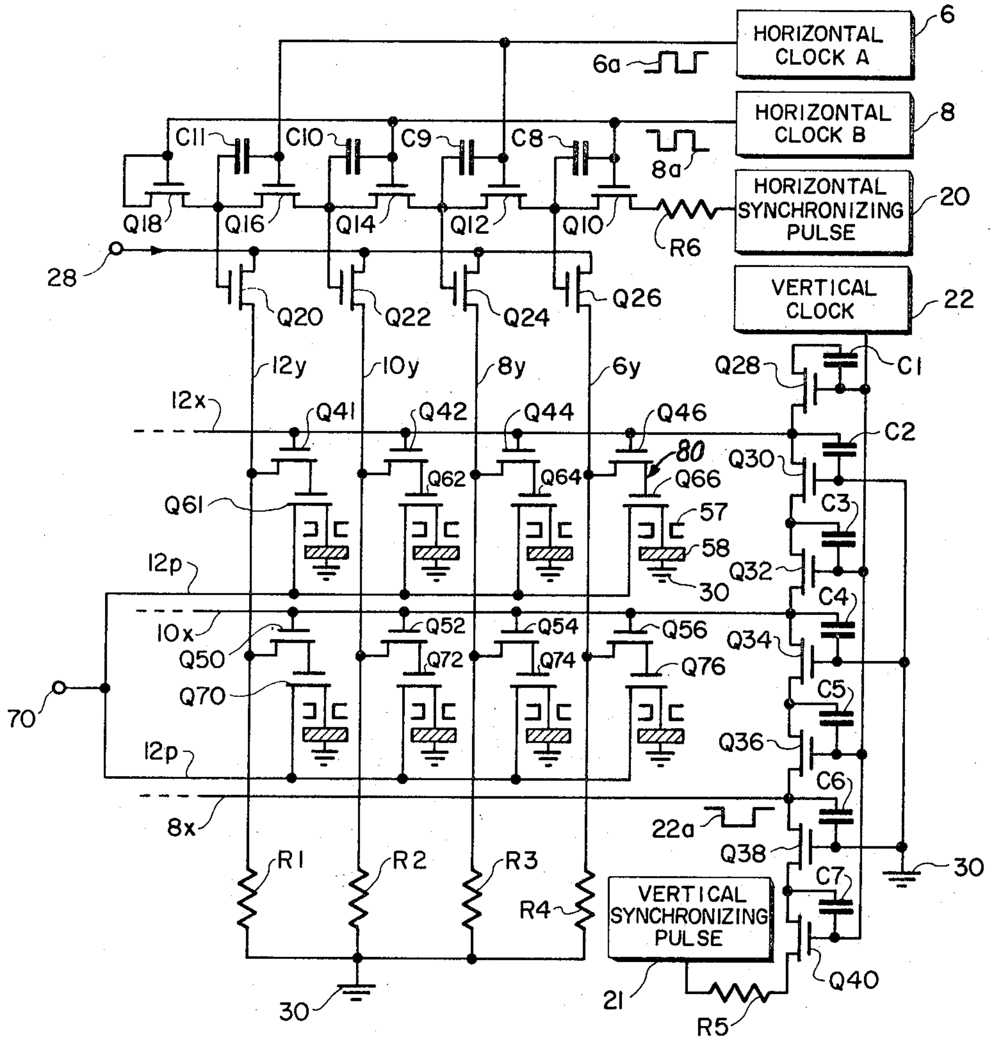
FIG. 2 is a schematic circuit similar to that of FIG. 1 with an additional metallic oxide semiconductor associated with each light emitting diode for storage of the addressing charge.

FIG. 1 illustrates a partial schematic of a matrix of display elements comprising electroluminescent display elements addressed by metallic oxide semiconductors (MOSs). A typical display element 4 (shown in the lower left of the matrix in FIG. 1) will be explained with reference to electroluminescent element 58, MOS Q50, conductive lead 59, and feedthrough hole 57. Voltage pulses from a vertical synchronizing pulse generator 21 are fed to the base of Q50 by way of lead 10*x*. Also, voltage pulses from a horizontal synchronizing pulse generator 20 triggers "on" video MOS Q20 which, in turn, allows the video input that is applied at terminal 28 to pass directly through Q20 to the source terminal of Q50. If a pulse from generator 21, represented as 22*a*, is present on lead 10*x* when the video pulse is present at the source terminal of Q50, the video signal will pass through Q50 and cause element 58 to luminesce. Even though this explanation covers only one element of the matrix, all of the other elements operate in a similar manner. An overall display is produced when all of the elements of the matrix have been swept.

The voltage pulses from generators 20 and 21 are "handed off" in bucket brigade fashion by column and row bucket brigade shift registers. The column bucket brigade shift registers is comprised of horizontal clocks A and B, represented by numerals 6 and 8, and generator 20, along with a bank of column shift register MOSs Q10, Q12, Q14, Q16, and Q18. The row bucket brigade shift register is comprised of vertical clock 22 and generator 21, along with a bank of row shift register MOSs Q28, Q30, Q32, Q34, Q36, Q38, and Q40. Horizontal clocks 6 and 8 produce square waves 6*a* and 8*a*, respectively, which are 180 degrees out of phase with each other. Waves 6*a* and 8*a* "hand off" in a bucket brigade manner the horizontal synchronizing pulses from circuit 20 along column shift register MOSs Q10, Q12, Q14, Q16, Q18, and others (not shown) to form the total horizontal portion of a display. The horizontal synchronizing pulses from generator 20 are passed through the column shift register MOSs and are applied to the gate electrodes of video MOSs Q20, Q22, Q24, Q26, and others (not shown) totaling the number of columns in the matrix of display elements. Terminal 28 is connected to the source terminals of the video MOSs. Video signals that are applied to terminal 28 are therefore also applied to all the source terminals of the video MOSs.

When a video signal is present at terminal 28 and the video MOSs are gated "on" by display information from horizontal clocks 6 and 8, the video signal will be transmitted to the source electrode of the display MOSs accordingly. These display MOSs are shown in FIG. 1 as Q41, Q42, Q44, Q46, Q50, Q52, Q54, and Q56 (and others not shown) totalling the number of display elements of the matrix. This display information present at clocks 6 and 8 may be transmitted on a high frequency carrier wave, such as a laser beam or a VHF channel, into the horizontal clocks of the column bucket brigade shift register. Similarly, display information present at vertical clock 22 "hands off" the vertical signal pulses from circuit 21 along row shift register MOSs Q40, Q38, Q36, Q34, Q32, Q30, Q28, and others (not shown) totaling the number of rows in the matrix of display elements. This display information is first received, amplified, and decoded using circuitry similar to a television receiver (with such circuitry not being a part of this invention) and is produced as digitalized information at the output of the column and row shift registers. During the time that one column is scanned by the horizontal shift register, the vertical shift register scans *all* of the rows.

In explanation of the operation of the display panel of FIG. 1, assume that all the MOSs are of the p-channel type. A single display element 4 (at the lower left side of FIG. 1) will be used to explain the operation of the display panel. Assume pulse 8*a* from horizontal clock B is negative at a certain instant. This negative pulse is applied to the source and gate terminals of Q18, a positive pulse 6*a* from clock 6 is applied to the drain terminal of Q18 through capacitor C11. At this same instant video MOS Q20 is "cutoff" by the positive pulse 6a at its gate. However, video MOS Q22 is triggered "on" at this same instant by the negative pulse 8*a* applied to the gate of Q22 through capacitor C10. Likewise, video MOSs Q24 is "off" and Q26 is "on." Any video information voltage present at terminal 28, which is connected to the source terminals of Q20 through Q26, is transferred to alternate columns leads of the matrix. The column leads are connected to source terminals of the matrix of display MOSs. As pulses 6*a* and 8*a* are alternately pulsed positively and negatively, the vertical clock pulse 22*a* from vertical clock 22 is applied to alternate gate electrodes of the row shift register MOSs. Pulse 22*a* is only shown until a negative excursion with the positive shoulders on each side. The negative portion of pulse 22a triggers "on" row shift register MOSs Q28, Q32, Q36, and Q40. At the same time the negative portion of pulse 22*a* is coupled through capacitors C1, C3, C5 and C7, respectively, to the source terminals of Q28, Q32, Q36, and Q40. The negative portion of pulse 22a is then passed through Q28, Q32, Q36, and Q40 and also through capacitors C2, C4, and C6 to ground terminal 30 and to the gate electrodes of Q30, Q34, and Q38. During the time that pulse 22*a* is on the soulder portion, the row shift register MOSs are not conducting and row leads 8*x*, 10*x* and 12*x* are at ground potential by ground terminal 30 being connected thereto through capacitors C6, C4, and C2, respectively. Negative pulses at the outputs of the row shift register MOSs trigger "on" the applicable display MOSs whereupon the presence of video information voltage on any of the columns 6*y*, 8*y*, 10*y*, and 12*y* will pass through the display MOS associated with the coincidence pulse of voltage on both the rows and columns.

The type MOS logic used with the present invention is that of direct current (d.c.) or static logic. A quasi-d.c. storage function can be performed with dynamic logic when clocks are operated at a high enough frequency, say of 5 kilo-Hertz. The method used in this invention is that of clocking the inherent gate capacitance of the shift register MOS device to provide simpler circuits and reduce power consumption since power is only consumed when the clocks are "on." The dynamic shift register mode of MOS devices are simply inverters connected in series by transmission gates. In the scanning system explained herein, the rows and columns are scanned separately. The row scanner shift register sweeps through all the rows each time one column is scanned by the horizontal shift register. For example, while column 12y is being pulsed, all of the rows in the matrix are pulsed by the output pulse 22a of generator 21. Pulse 22a is "handed off" along the row shift register MOSs Q40 through Q28 almost instantaneously by operation of the vertical clock 22. Synchronously, another of the columns, say column 10y, is scanned by information from the horizontal shift register while all the rows are scanned, etc., until all the columns have been scanned. As stated hereinabove, the MOSs used as display MOSs are of the p-channel type. These MOSs provide a good switch for applying the video input information at terminal 28 to each electroluminescent element 58, since at the time that the MOS gate voltage, on the row, is the same as the MOS source voltage, on the column, the video input information will not go through the p-channel MOS to element 58. However, when the voltage at the MOS gate is more negative than at the MOS source, an electrostatic field is established that inverts the n-material under the gate to a p-channel existing between the source and drain. The function of resistors R1, R2, R3, and R4 is to return the source terminal of the display MOSs to ground potential when the video input information voltage is removed. With the use of only one display MOS per electroluminescent element 58, element 58 can be pulsed to high brightness, say of about $10^6$ foot-lamberts, during the very brief addressing time of about 200 microseconds, corresponding with a frequency of 5 kilocycles. The capaictors in the shift registers are of large enough capacitance to hold a charge from either of pulses 6a, 8a, and 22a until the next pulse is applied. Resistors R5 and R6 also serve as appropriate time constants for the capacitors.

Looking now at the embodiment of FIG. 2, a storage element is shown between the display MOSs and the electroluminescent element. These storage elements are shown as Q61, Q62, Q64, Q66, Q70, Q72, Q74, and Q76. These storage elements may be metallic nitride oxide semiconductors (MNOSs). In the embodiment of FIG. 2, the MNOS layer is first deposited on the thermally oxidized silicon layer on the back of the substrate and then the MOS layer is deposited over the MNOS layer, being conductively connected thereto. One storage display element 80 used in the explanation of one display element, is shown at the upper right of the matrix in FIG. 2. Element 80 comprises MOS Q46, MNOS Q66, leads 12x and 6y and power lead 12p connected thereto, feedthrough hole 57, and electroluminescent element 58 connected to ground 30. An explanation of only one element 80 is shown hereinbelow. All of the storage display elements work identically. Assume the MOS to being p-channel type. In the embodiment of FIG. 2, negative pulses from the row shift register MOSs switch the video information present at terminal 28 and to the source terminals of the video MOS. The storage display elements also have the vertical sweep voltages triggered by the column shift registers applied to the gate electrodes of the display MOSs Q41, Q42, Q44, Q46, Q50, Q52, Q54, and Q56. The video information pulse voltages that are present at the source terminal of the display MOS is passed on through the display MOSs to the gate terminals of the storage MNOSs Q61, Q62, Q64, Q66, Q70, Q72, Q74, and Q76 for storage therein until a voltage is built up sufficient to cause the voltage at the output of the MOSs to pass through the storage MNOSs to the electroluminescent elements 58. The voltage applied to terminal 70 is in common connection with the MNOSs to establish the required positive charge accumulation near the nitride layer. Negative voltages at the drain of the MOSs that are of sufficient duration or amplitude will cause the positive voltage to go negative, causing the appropriate electroluminescent element 58 to luminesce. The overall display of the typically 250,000 storage display elements is according to the information fed to the shift registers and the video information at terminal 28.

I claim:

1. A method of fabricating an electroluminescent display panel, the steps comprising:

providing an insulating substrate;

coating one side of said substrate with an epitaxial silicon layer;

laying out pads for making MOS transitions on a photomask;

coating said one side of substrate with a photoresist and illuminating said photoresists with ultraviolet light;

etching off said silicon layer in a desired pattern using a mixture of hydrofluoric acid and nitric acid and oxidizing to form thin silicon oxide skins;

etching said skins with photoresist techniques;

forming gate drain and source electrodes of MOSs by metallization;

electroplating interconnections between said gate electrodes to form row leads;

electroplating interconnections between said source electrodes to form column leads;

providing a rectangular wafer of p-type electroluminescent material;

coating said wafer with a n-type liquid phase epitaxy grown double layer;

making deep grooves in the n-type double layer extending into the p-type material;

filling said grooves almost full with insulating cement;

coating the n-type surface and partially filled grooves of insulating cement with a layer of indium-tin;

lapping off said layer of indium-tin from surface leaving only a matrix electrical contact between said n-type and said indium-tin in the grooves;

drilling a matrix of feedthrough holes through said substrate and filling said holes with conducting cement; and connecting the side of said substrate that is opposite said epitaxial silicon layer to the side of said p-type material that is opposite said n-type liquid phase epitaxy grown double layer with the connection being such that the matrix of said drain electrodes of said MOSs are electrically connected through said conducting cement and said p-type and n-type electroluminescent materials to said matrix of electrical contacts wherein said matrix of electrical contacts are connected to ground.

2. A method of fabricating an electroluminescent display panel as set forth in claim 1, after the step of coating one side of said substrate with an epitaxial silicon layer, further comprising the steps of:

laying out pads for making MNOS transistors;

forming gate, drain, and source electrodes by metallization;

and providing a power source wherein gate electrode of MNOS is connected to said source electrode of MOS, said source electrode of MNOS is connected to said power source and said drain electrode of MNOS is connected to said electroluminescent element.

3. A method of fabricating an electroluminescent display panel as set forth in claim 1 wherein said insulating substrate is a spinel single crystal wafer.

4. A method of fabricating an electroluminescent display panel as set forth in claim 1 wherein said insulating substrate is a sapphire single crystal wafer.

5. A method of fabricating an electroluminescent display panel as set forth in claim 1 wherein said insulating substrate is made of polycrystalline ceramic.

6. A method of fabricating an electroluminescent display panel as set forth in claim 1 wherein said p-type electroluminescent material is gallium arsenide and gallium phosphide alloys.

7. A method of fabricating an electroluminescent display panel as set forth in claim 1 wherein said p-type electroluminescent material is gallium arsenide coated with up-conversion phosphor.

8. A method of fabricating an electroluminescent display panel as set forth in claim 1 wherein the step of drilling a matrix of feedthrough holes is be electron beam drilling with an automatic step-and-repeat machine.

* * * * *